(12) United States Patent
Yap et al.

(10) Patent No.: US 8,274,017 B2
(45) Date of Patent: Sep. 25, 2012

(54) MULTIFUNCTIONAL HEATER/CHILLER PEDESTAL FOR WIDE RANGE WAFER TEMPERATURE CONTROL

(75) Inventors: Lipyeow Yap, Santa Clara, CA (US); Tuan Anh Nguyen, Sunnyvale, CA (US); Dale R. Du Bois, Los Gatos, CA (US); Sanjeev Baluja, Sunnyvale, CA (US); Thomas Nowak, Cupertino, CA (US); Juan Carlos Rocha-Alvarez, San Carlos, CA (US); Jianhua Zhou, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 446 days.

(21) Appl. No.: 12/641,819

(22) Filed: Dec. 18, 2009

(65) Prior Publication Data

US 2011/0147363 A1 Jun. 23, 2011

(51) Int. Cl.
*H05B 3/68* (2006.01)
(52) U.S. Cl. ........................................ 219/385
(58) Field of Classification Search ................ 219/385
See application file for complete search history.

(56) References Cited

U.S. PATENT DOCUMENTS

| | | | |
|---|---|---|---|
| 5,811,762 A | 9/1998 | Tseng | |
| 6,278,089 B1 | 8/2001 | Young et al. | |
| 6,998,579 B2 | 2/2006 | Inagawa et al. | |
| 7,221,553 B2 | 5/2007 | Nguyen et al. | |
| 7,311,782 B2 | 12/2007 | Strang et al. | |
| 2001/0040157 A1* | 11/2001 | Duddy et al. | 219/444.1 |
| 2004/0035530 A1 | 2/2004 | Ilzuka | |
| 2006/0272774 A1* | 12/2006 | Maehara et al. | 156/345.28 |
| 2006/0281310 A1 | 12/2006 | Smith et al. | |
| 2007/0221648 A1* | 9/2007 | Unno et al. | 219/385 |
| 2010/0136773 A1* | 6/2010 | Akae et al. | 438/507 |

OTHER PUBLICATIONS

International Search Report and Written Opinion dated Aug. 31, 2011 for International Application No. PCT/US2010/060069.

* cited by examiner

*Primary Examiner* — David S Blum
(74) *Attorney, Agent, or Firm* — Patterson & Sheridan, LLP

(57) ABSTRACT

Embodiments of the invention generally relate to a semiconductor processing chamber and, more specifically, a heated support pedestal for a semiconductor processing chamber. In one embodiment, a pedestal for a semiconductor processing chamber is provided. The pedestal comprises a substrate support comprising a conductive material and having a support surface for receiving a substrate, a resistive heater encapsulated within the substrate support, a hollow shaft coupled to the substrate support at a first end and a mating interface at an opposing end, the hollow shaft comprising a shaft body having a hollow core, and a cooling channel assembly encircling the hollow core and disposed within the shaft body for removing heat from the pedestal via an internal cooling path, wherein the substrate support has a heat control gap positioned between the heating element and the ring-shaped cooling channel.

20 Claims, 8 Drawing Sheets

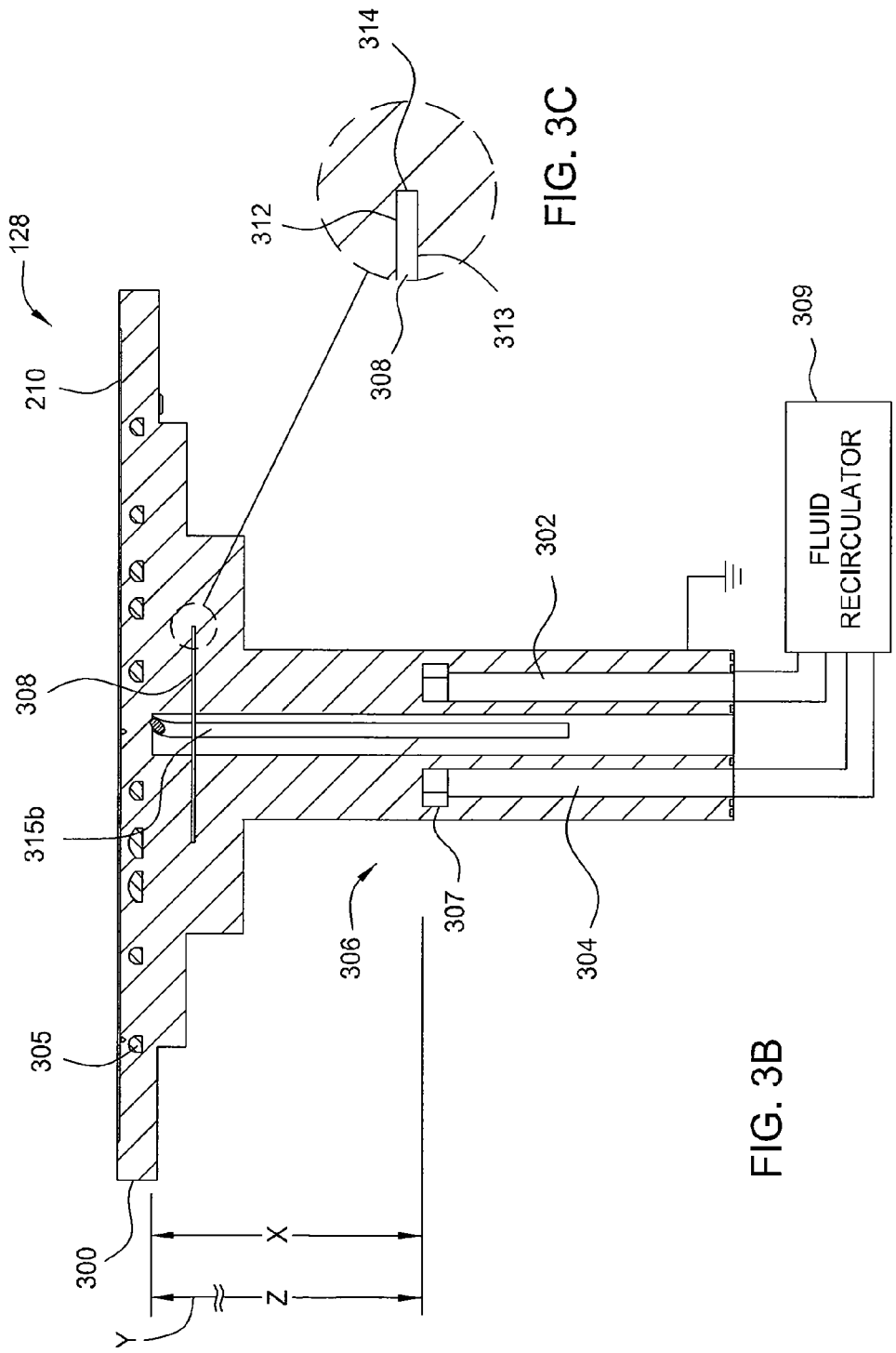

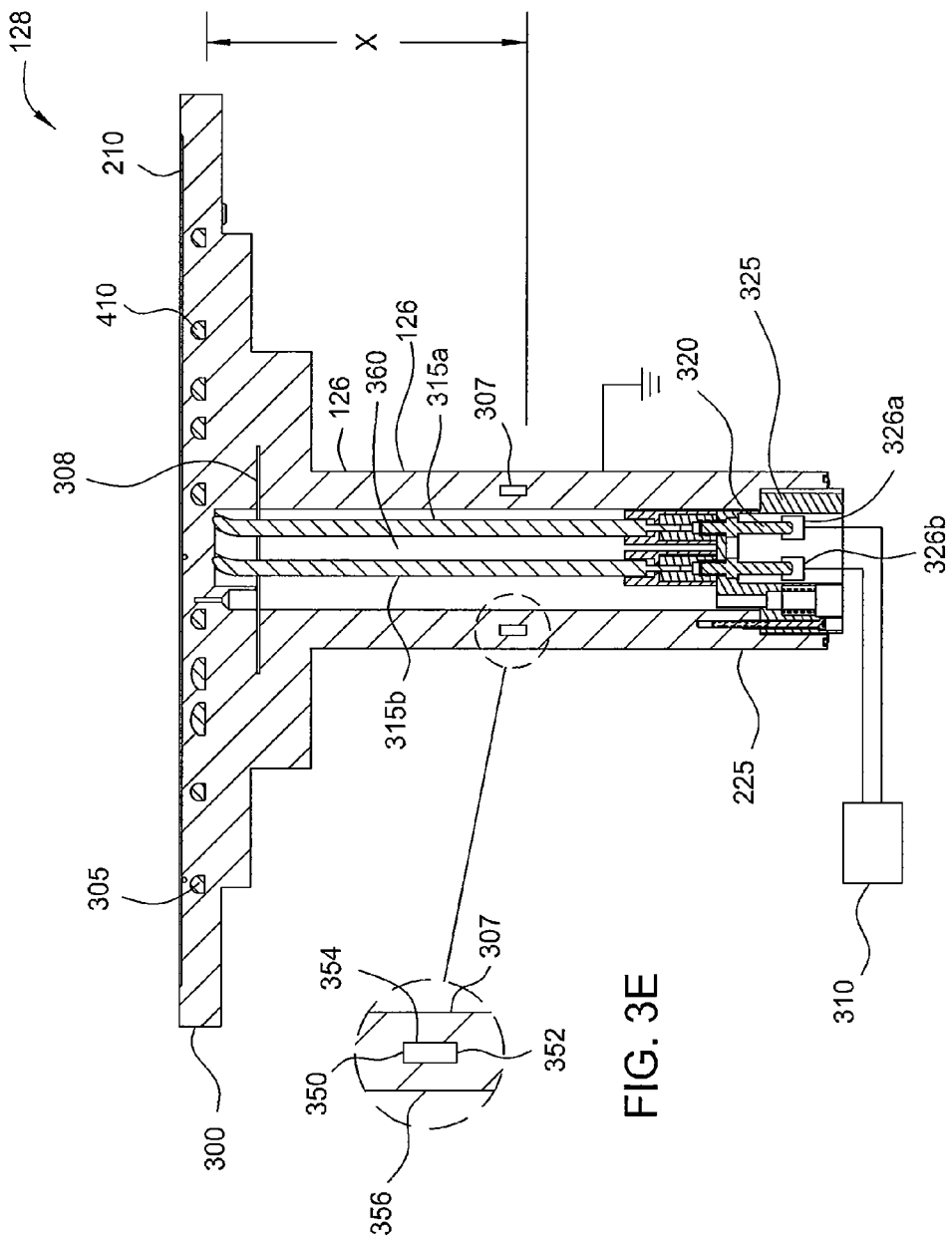

MULTIFUNCTIONAL HEATER/CHILLER PEDESTAL FOR WIDE RANGE WAFER TEMPERATURE CONTROL

BACKGROUND OF THE INVENTION

1. Field of the Invention

Embodiments of the invention generally relate to a semiconductor processing chamber and, more specifically, a heated support pedestal for a semiconductor processing chamber.

2. Description of the Related Art

Semiconductor processing involves a number of different chemical and physical processes whereby minute integrated circuits are created on a substrate. Layers of materials which make up the integrated circuit are created by processes including chemical vapor deposition, physical vapor deposition, epitaxial growth, and the like. Some of the layers of material are patterned using photoresist masks and wet or dry etching techniques. The substrates utilized to form integrated circuits may be silicon, gallium arsenide, indium phosphide, glass, or other appropriate materials.

In the manufacture of integrated circuits, plasma processes are often used for deposition or etching of various material layers. Plasma processing offers many advantages over thermal processing. For example, plasma enhanced chemical vapor deposition (PECVD) allows deposition processes to be performed at lower temperatures and at higher deposition rates than achievable in analogous thermal processes. Thus, PECVD is advantageous for integrated circuit fabrication with stringent thermal budgets, such as for very large scale or ultra-large scale integrated circuit (VLSI or ULSI) device fabrication.

The processing chambers used in these processes typically include a substrate support or pedestal disposed therein to support the substrate during processing. In some processes, the pedestal may include an embedded heater adapted to control the temperature of the substrate and/or provide elevated temperatures that may be used in the process. Proper temperature control and uniform heating of the substrate during substrate processing is very important, particularly as the size of integrated circuits decreases. Conventional supports with embedded heaters often have numerous hot and cold spots which affect the quality of films deposited on the substrate.

The planarity of the substrate surface is also quite important throughout the manufacture of integrated circuits. Thus, the surface of the pedestal which holds the substrate has to be as planar as possible. When heated, conventional substrate support pedestals are very likely to bow upwards as the center of the pedestal heats up and the periphery of the pedestal loses heat. The warped support pedestal may cause warpage of the substrate held thereon, thus greatly reducing the planarity of the wafer surface.

Therefore, there is a need for a pedestal that provides active temperature control at all times throughout a complete process cycle.

SUMMARY OF THE INVENTION

Embodiments of the invention generally relate to a semiconductor processing chamber and, more specifically, a heated support pedestal for a semiconductor processing chamber. In one embodiment, a pedestal for a semiconductor processing chamber is provided. The pedestal comprises a substrate support comprising a conductive material and having a support surface for receiving a substrate, a resistive heater encapsulated within the substrate support, a hollow shaft coupled to the substrate support at a first end and to a mating interface at a second end, the hollow shaft comprising a shaft body having a hollow core, and a cooling channel assembly encircling the hollow core and disposed within the shaft body for removing heat from the pedestal via an internal cooling path, wherein the substrate support has a heat control gap positioned between the heating element and the ring-shaped cooling channel.

In another embodiment, a pedestal for a semiconductor processing chamber is provided. The pedestal comprises a substrate support comprising a conductive material and having a support surface for receiving a substrate, a hollow shaft coupled with the substrate support comprising a shaft body having a hollow core, and an active cooling system providing for active control of the temperature of a substrate positioned on the support surface comprising a heating element encapsulated within the substrate support, and a cooling channel assembly encircling the hollow core and disposed within the shaft body for removing heat from the pedestal via an internal cooling path, wherein a heat control gap is positioned between the heating element and the ring-shaped cooling channel.

In yet another embodiment, a plasma processing system is provided. The plasma processing system comprises a processing chamber body having sidewalls, a bottom wall, and an interior sidewall defining a pair of processing regions, a radio frequency source coupled with the processing chamber body, and a pedestal disposed in at least one of the pair of processing regions. The pedestal comprises a substrate support comprising a conductive material and having a support surface for receiving a substrate, a hollow shaft coupled with the substrate support comprising a shaft body having a hollow core, and an active cooling system providing for active control of the temperature of a substrate positioned on the support surface comprising a heating element encapsulated within the substrate support, and a cooling channel assembly encircling the hollow core and disposed within the shaft body for removing heat from the pedestal via an internal cooling path, wherein a heat control gap is positioned between the heating element and the ring-shaped cooling channel, and a radio frequency source is coupled with the processing chamber body.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3B is a cross-sectional side view of one embodiment of a pedestal taken along lines 3B-3B of FIG. 3A;

FIG. 3C is an enlarged portion of the cross-sectional view of one embodiment of the pedestal of FIG. 3B;

FIG. 3D is a cross-sectional side view taken along lines 3D-3D of FIG. 3A;

FIG. 3E is an enlarged portion of the cross-sectional view of one embodiment of the pedestal of FIG. 3D;

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
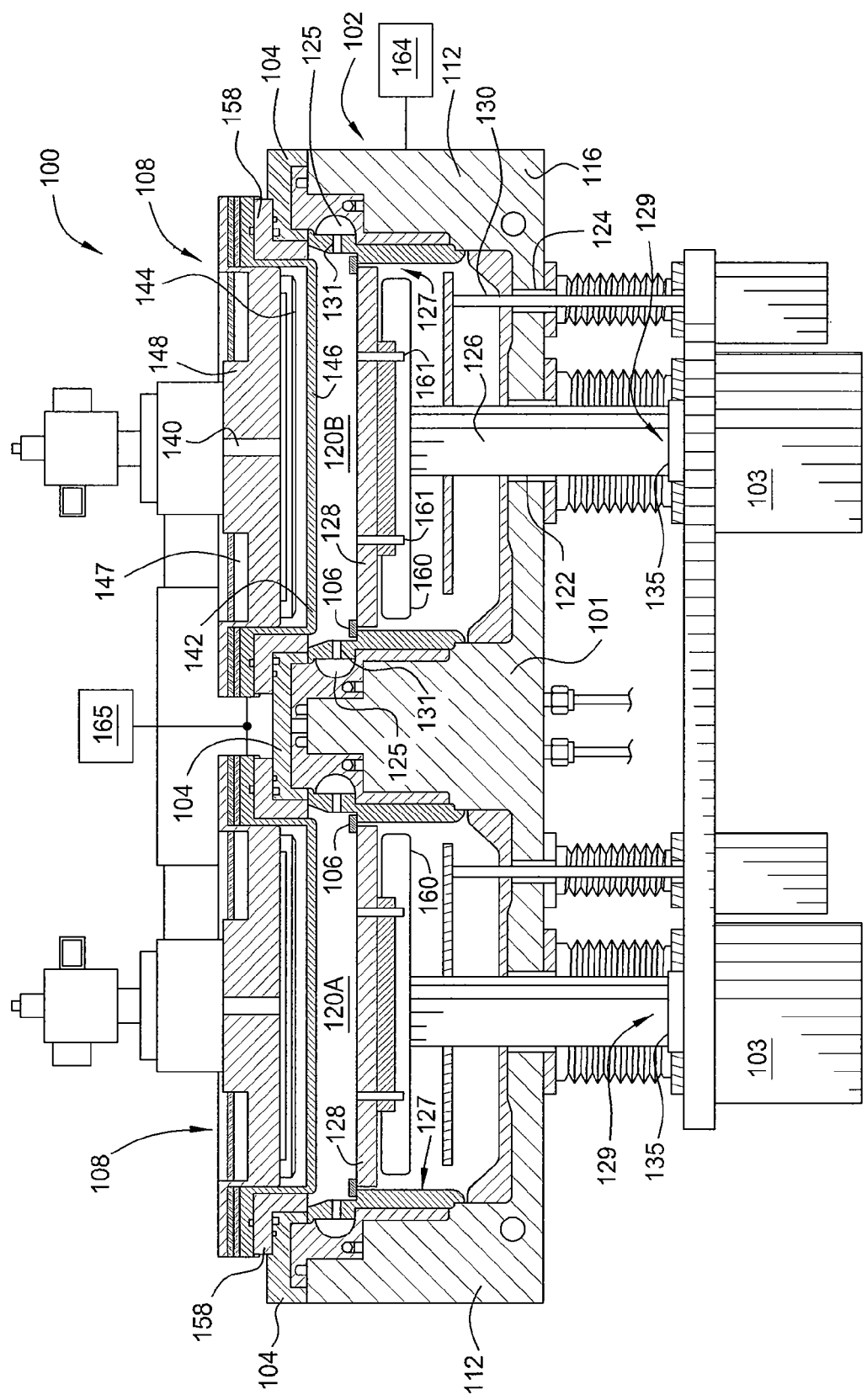
FIG. 1 is a partial cross sectional view of one embodiment of a plasma system.

Embodiments of the invention generally relate to a semiconductor processing chamber and, more specifically, a heated support pedestal for a semiconductor processing chamber. Embodiments of the present invention are illustratively described below in reference to plasma chambers. In one embodiment, the plasma chamber is utilized in a plasma enhanced chemical vapor deposition (PECVD) system. Examples of PECVD systems that may be adapted to benefit from the embodiments described herein include a PRODUCER® SE CVD system, a PRODUCER® GT™ CVD system or a DXZ® CVD system, all of which are commercially available from Applied Materials, Inc., Santa Clara, Calif. The Producer® SE CVD system (e.g., 200 mm or 300 mm) has two isolated processing regions that may be used to deposit thin films on substrates, such as conductive films, silanes, carbon-doped silicon oxides and other materials and is described in U.S. Pat. Nos. 5,855,681 and 6,495,233, both of which are incorporated by reference. The DXZ® CVD chamber is disclosed in U.S. Pat. No. 6,364,954, which is also incorporated by reference. Although the exemplary embodiment includes two processing regions, it is contemplated that the embodiments described herein may be used to advantage in systems having a single processing region or more than two processing regions. It is also contemplated that the embodiments described herein may be utilized to advantage in other plasma chambers, including etch chambers, ion implantation chambers, plasma treatment chambers, and stripping chambers, among others. It is further contemplated that the embodiments described herein may be utilized to advantage in plasma processing chambers available from other manufacturers.

Embodiments of the pedestal described herein address the need for active temperature control of a substrate during processing at all times over a complete process cycle. Certain embodiments described herein provide higher temperature control at temperatures upwards of 400° C. using an embedded heating element with a minimal temperature gradient (<10° C.) with unique element patterns. Certain embodiments described herein can remove larger thermal loads (e.g. upwards of 2,000 Watts) from either an external source like RF coupling or an internal source such as the embedded heating element by flowing active coolant through body of the pedestal. Certain embodiments described herein provide a lower desired temperature gradient through the active control of the heater element together with the flow rate of the coolant through the body of the pedestal.

Certain embodiments described herein provide the ability to actively control the temperature of the substrate over a wide range while the substrate is subjected to numerous processes and chamber conditions (e.g. heater faceplate, coupling RF struck in chamber, process gases, chemistry, etc.) Active temperature control may be achieved through two active temperature fluxs; first, heat is provided to the pedestal via a brazed/embedded heating element, and second, heat is removed from the pedestal via an internal coolant path. Thus the temperature of the pedestal surface (which the substrate rests on) can be controlled to a desired temperature set point by controlling the level of these two fluxs. Increased heat can be generated by delivering more power to the heating element and reducing the flow rate of the coolant (or reducing the coolant inlet temperature), or the reverse can be done to achieve a cooler pedestal temperature. The wider temperature control range is achieved through controlling the interactions between the heat sources (internal from the heating element or external from the chamber or process conditions) and the heat drain (internal active coolant). In one embodiment, this is achieved by positioning the heating element in the support body closer to the support surface where the substrate rests to maximize the highest temperature that can be achieved and by positioning the cooling channel in the lower body of the shaft at a height to drain out the desired amount of heat.

Certain embodiments described herein further provide the ability to control temperature uniformity within 10° C. over the range of the temperature controlled. In one embodiment, this may be achieved by positioning the heating element relative to the cooling channel as described above, and also utilizing an air gap positioned between the heating element and the cooling channel to further control the path of heat flow. In one embodiment, the placement of the cooling channel, air gap, and heating element yields a maximum planar deflection of the support surface of no greater than 5 thousandth of an inch which reduces the likelihood of the substrate sliding during processing.

In one embodiment, the pedestal comprises an aluminum alloy. In one embodiment, the aluminum alloy is an aluminum alloy containing magnesium and silicon such as Aluminum 6061. The Aluminum alloy provides three important features: 1) high thermal conductivity which contributes to the interaction of heat flow from heat source to the coolant, 2) capacity to be handled by various machining techniques (e.g. brazing the shaft assembly to incorporate cooling channels at an intermediate height, bead-blasting the support surface to increase radiative heat loss, nickel plating the coating channel to be able to flow hard water, and 3) lower cost to produce.

FIG. 1 is a partial cross sectional view of an exemplary plasma system 100 having a pedestal 128 according to embodiments described herein. As described herein, the pedestal 128 comprises an active cooling system which allows for active control of the temperature of a substrate positioned on the pedestal over a wide temperature range while the substrate is subjected to numerous process and chamber conditions. The plasma system 100 generally comprises a processing chamber body 102 having sidewalls 112, a bottom wall 116 and an interior sidewall 101 defining a pair of processing regions 120A and 120B. Each of the processing regions 120A-B is similarly configured, and for the sake of brevity, only components in the processing region 120B will be described.

A pedestal 128 is disposed in the processing region 120B through a passage 122 formed in the bottom wall 116 in the system 100. The pedestal 128 is adapted to support a substrate (not shown) on the upper surface thereof. The pedestal 128 may include heating elements, for example resistive elements, to heat and control the substrate temperature at a desired process temperature. Alternatively, the pedestal 128 may be heated by a remote heating element, such as a lamp assembly.

The pedestal 128 is coupled by a shaft 126 to a power outlet or power box 103, which may include a drive system that controls the elevation and movement of the pedestal 128 within the processing region 120B. The shaft 126 also contains electrical power interfaces to provide electrical power to the pedestal 128. The power box 103 also includes interfaces for electrical power and temperature indicators, such as a thermocouple interface. The shaft 126 also includes a base assembly 129 adapted to detachably couple to the power box 103. A circumferential ring 135 is shown above the power box 103. In one embodiment, the circumferential ring 135 is a shoulder adapted as a mechanical stop or land configured to provide a mechanical interface between the base assembly 129 and the upper surface of the power box 103.

A rod 130 is disposed through a passage 124 formed in the bottom wall 116 and is utilized to activate substrate lift pins 161 disposed through the pedestal 128. The substrate lift pins 161 selectively space the substrate from the pedestal to facilitate exchange of the substrate with a robot (not shown) utilized for transferring the substrate into and out of the processing region 120B through a substrate transfer port 160.

A chamber lid 104 is coupled to a top portion of the chamber body 102. The lid 104 accommodates one or more gas distribution systems 108 coupled thereto. The gas distribution system 108 includes a gas inlet passage 140 which delivers reactant and cleaning gases through a showerhead assembly 142 into the processing region 120B. The showerhead assembly 142 includes an annular base plate 148 having a blocker plate 144 disposed intermediate to a faceplate 146. A radio frequency (RF) source 165 is coupled to the showerhead assembly 142. The RF source 165 powers the showerhead assembly 142 to facilitate generation of plasma between the faceplate 146 of the showerhead assembly 142 and the heated pedestal 128. In one embodiment, the RF source 165 may be a high frequency radio frequency (HFRF) power source, such as a 13.56 MHz RF generator. In another embodiment, RF source 165 may include a HFRF power source and a low frequency radio frequency (LFRF) power source, such as a 300 kHz RF generator. Alternatively, the RF source may be coupled to other portions of the processing chamber body 102, such as the pedestal 128, to facilitate plasma generation. A dielectric isolator 158 is disposed between the lid 104 and showerhead assembly 142 to prevent conducting RF power to the lid 104. A shadow ring 106 may be disposed on the periphery of the pedestal 128 that engages the substrate at a desired elevation of the pedestal 128.

Optionally, a cooling channel 147 is formed in the annular base plate 148 of the gas distribution system 108 to cool the annular base plate 148 during operation. A heat transfer fluid, such as water, ethylene glycol, a gas, or the like, may be circulated through the cooling channel 147 such that the base plate 148 is maintained at a predefined temperature.

A chamber liner assembly 127 is disposed within the processing region 120B in very close proximity to the sidewalls 101, 112 of the chamber body 102 to prevent exposure of the sidewalls 101, 112 to the processing environment within the processing region 120B. The liner assembly 127 includes a circumferential pumping cavity 125 that is coupled to a pumping system 164 configured to exhaust gases and byproducts from the processing region 120B and control the pressure within the processing region 120B. A plurality of exhaust ports 131 may be formed on the chamber liner assembly 127. The exhaust ports 131 are configured to allow the flow of gases from the processing region 120B to the circumferential pumping cavity 125 in a manner that promotes processing within the system 100.

Figure 2A:
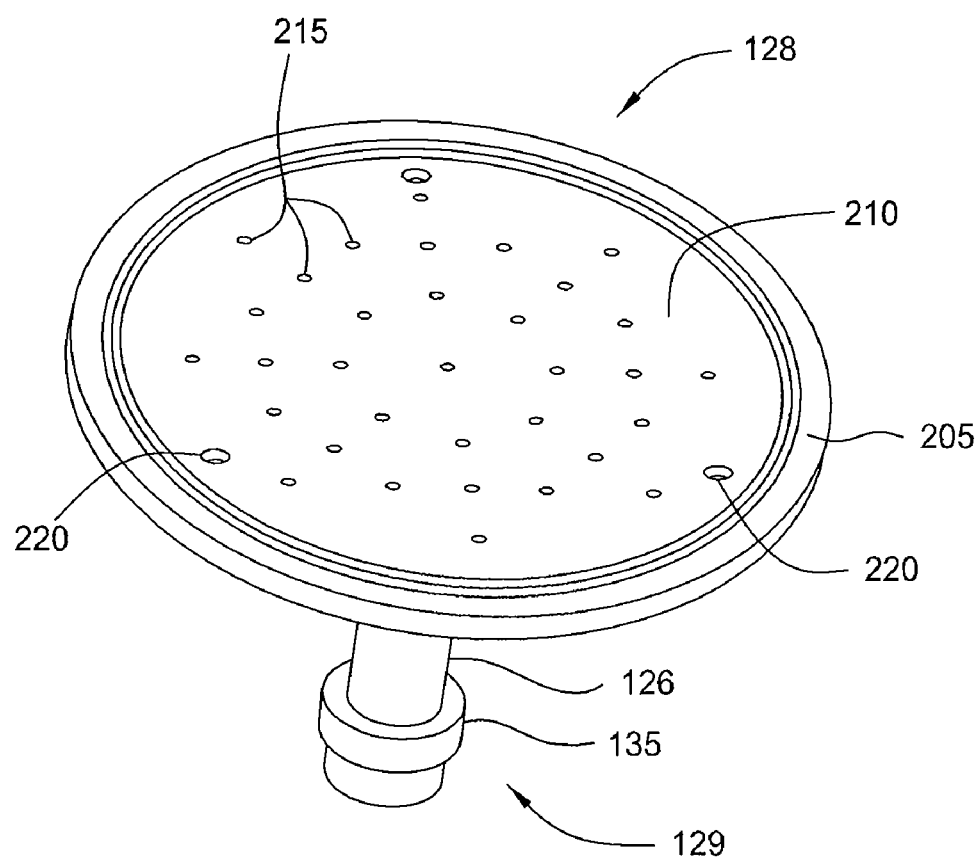
FIG. 2A is an isometric side view of one embodiment of a pedestal shown in FIG. 1.

FIG. 2A is an isometric top view of one embodiment of a pedestal 128 that is utilized in the plasma system 100. The pedestal 128 includes a shaft 126 and a base assembly 129 opposite a circular substrate support 205. In one embodiment, the shaft 126 is configured as a tubular member or hollow shaft. In one embodiment, the base assembly 129 is utilized as a detachable mating interface with electrical connections disposed in or on the power outlet or power box 103. The substrate support 205 includes a substrate receiving surface or support surface 210 that is substantially planar. The support surface 210 may be adapted to support a 200 mm substrate, a 300 mm substrate, or a 450 mm substrate. In one embodiment, the support surface 210 includes a plurality of structures 215, which may be bumps or protrusions extending above the plane of the support surface 210. The height of each of the plurality of structures 215 are substantially equal to provide a substantially planar substrate receiving plane or surface that is slightly elevated or spaced-away from the support surface 210. In one embodiment, each of the structures 215 are formed of or coated with a material that is different from the material of the support surface 210. The substrate support 205 also includes a plurality of openings 220 formed therethrough that are adapted to receive a lift pin 161 (FIG. 1).

In one embodiment, the body of the substrate support 205 and shaft 126 are made of a conductive metallic material while the base assembly 129 is made of a combination of a conductive metallic material and an insulative material. Fabricating the substrate support 205 from a conductive metallic material lowers the cost of ownership as compared to substrate supports made of ceramics. Additionally, the conductive metallic material serves to shield an embedded heater (not shown in this view) from RF power. This increases the efficiency and lifetime of the substrate support 205, which decreases cost of ownership.

In one embodiment, the body of the substrate support 205 and shaft 126 are made solely of an aluminum material, such as an aluminum alloy. In a specific embodiment, both of the substrate support 205 and shaft are made of 6061 Aluminum. In one embodiment, the base assembly 129 comprises aluminum portions and insulative portions, such as a polyetheretherketone (PEEK) resin disposed therein to electrically insulate portions of the base assembly 129 from the conductive portions of the substrate support 205 and shaft 126. In one embodiment, the body of the substrate support 205 is made from an aluminum material while each of the structures 215 disposed on the support surface 210 are made of or coated with a ceramic material, such as aluminum oxide.

In one embodiment, the support surface 210 of the pedestal 128 is textured. The support surface 210 may be textured using techniques known in the art, for example, bead blasting, an etch-back process, or combinations thereof. In one embodiment, the root mean square ("RMS") roughness of the textured support surface 210 of the pedestal 128 may be from about 0.75 microns to about 6 microns, for example, between about 1.5 microns and about 5 microns, for example about 2 microns.

Figure 2B:
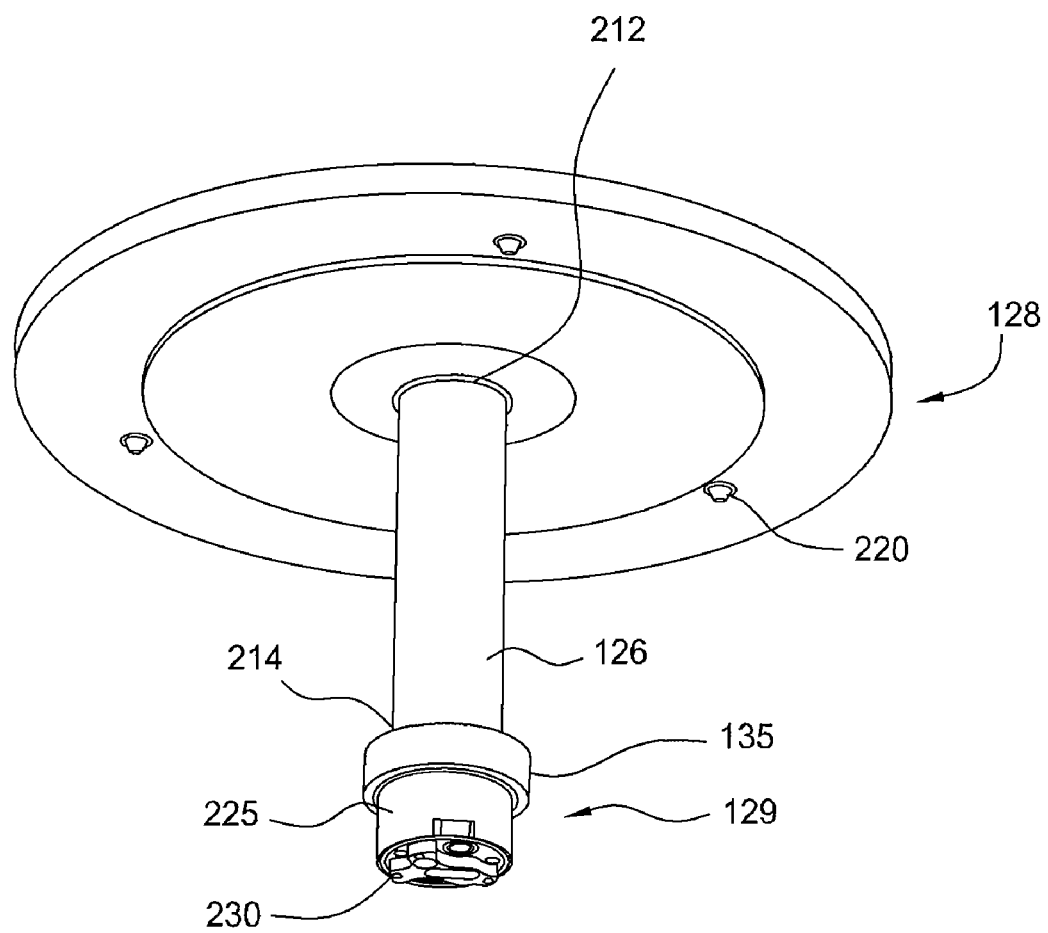
FIG. 2B is a isometric bottom view of one embodiment of a pedestal shown in FIG. 1.

FIG. 2B is an isometric bottom view of one embodiment of a pedestal 128. The shaft 126 includes a first end 212 that is coupled to the substrate support 205 and a second end 214 coupled to a base assembly 129 opposite the substrate support 205. In this embodiment, the base assembly 129 includes a slotted conductive portion 225 that is coupled to and/or containing a dielectric plug 230. In one embodiment, the slotted conductive portion 225 may be configured as a plug or a male interface adapted to mate with the power box 103 (FIG. 1). In the embodiment depicted in FIG. 2B, the conductive portion 225 may be circular in cross-section having slots formed at least partially through an outer surface or wall. The dielectric plug 230 may be configured as a socket or a female interface or, alternatively, comprising a portion or portions that are configured as a socket or female interface adapted to receive or mate with electrical connections within the power box 103. In one embodiment, the slotted conductive portion 225 may be an integral extension of the shaft 126 and made of an aluminum material, while the dielectric plug 230 is made of a PEEK resin.

The base assembly 129 also includes the circumferential ring 135 adapted to receive an o-ring 240 that interfaces with the power box 103 depicted in FIG. 1. In this embodiment, the slotted conductive portion 225 includes an opening adapted to receive the dielectric plug 230 and the dielectric plug 230 fastens to the slotted conductive portion 225. The dielectric plug 230 also includes openings or sockets formed therein to receive electrical leads from the power box 103.

Figure 3A:
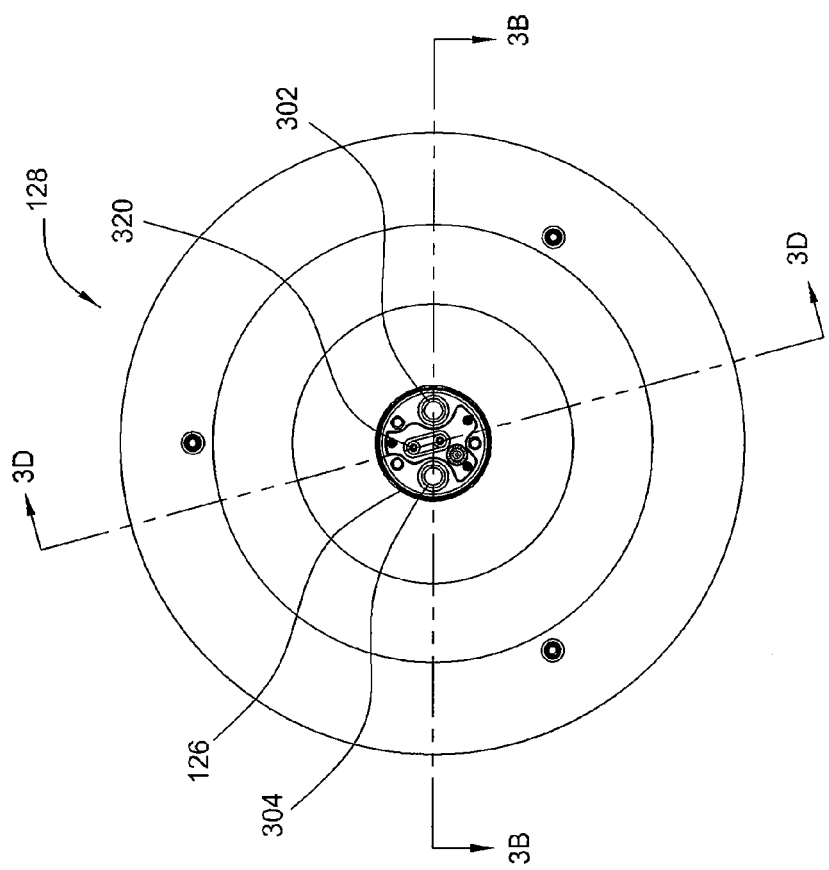
FIG. 3A is a bottom schematic view of one embodiment of a pedestal shown in FIG. 1.

FIG. 3A is a bottom schematic view of one embodiment of a pedestal 128. The dielectric plug 230 has a cooling channel inlet 302 for delivering a coolant to a cooling channel, a cooling channel outlet 304 for removing coolant from the cooling channel, and a conductive plug 320.

FIG. 3B is a cross-sectional side view taken along lines 3B-3B of FIG. 3A of one embodiment of a pedestal 128 having an active cooling system. FIG. 3C is an enlarged cross-sectional view of one embodiment of the pedestal of FIG. 3B. In one embodiment, the active cooling system comprises a resistive heater assembly 305, a cooling channel assembly 306, and a heat control gap 308. The resistive heater 305 is disposed or encapsulated in a conductive body 300 of the substrate support 205. In one embodiment, the conductive body 300 is made of a material consisting of a conductive metal, such as aluminum.

The cooling channel assembly 306 has a cooling channel 307, a cooling channel inlet 302, a cooling channel outlet 304, and a fluid recirculator 309 for supplying a heat transfer fluid or "coolant" to the cooling channel assembly. In one embodiment, the cooling channel 307 is a ring-shaped channel positioned in the body of the shaft 126 encircling the hollow portion of the shaft 126. With reference to FIG. 3E, the cooling channel 307 is defined by an upper wall 350, an opposing lower wall 352, an inner peripheral wall 354, and an outer peripheral wall 356. In one embodiment, the cooling channel 307 is a continuous ring which encircles the diameter of the hollow portion of the shaft 126. In certain embodiments, the cooling channel 307 is a partial ring which only encircles a portion of the hollow portion of the shaft 126.

In one embodiment, the cooling channel inlet 302 is a longitudinal channel extending through the shaft 126 of the pedestal assembly 128. A first end of the cooling channel inlet 302 is coupled with fluid recirculator 309 and a second end of the cooling channel inlet 302 is fluidly coupled with the cooling channel 307. In one embodiment, the cooling channel outlet 304 is a longitudinal channel extending through the shaft 126 of the pedestal assembly 128. A first end of the cooling channel outlet 304 is coupled with the cooling channel 307 and a second end of the cooling channel outlet is coupled with the fluid recirculator 309.

In operation the heat transfer fluid may be reused and continuously pumped through the cooling channel assembly 306 by the fluid recirculator 309. In certain embodiments, the heat transfer fluid may be heated or cooled to a pre-selected temperature by the fluid recirculator 309 prior to entering the cooling channel inlet 302. For example, the fluid recirculator 309 may comprise a pump (not shown) to pump the heat transfer fluid through the cooling channel assembly 306, a cooler or heater (also not shown) to cool or heat the heat transfer fluid, and a thermostat (also not shown) to monitor the temperature of the heat transfer fluid and control the cooler or heater to maintain the temperature at a desired level. The fluid recirculator 309 may also comprise pressure gauges for monitoring fluid pressure, gauges, valves for controlling the flow, and other components for controlling the flow of heat transfer fluid which are not described for the sake of brevity. In operation, the heat transfer fluid is supplied to the cooling channel inlet 302 of the cooling channel assembly 306. The heat transfer fluid is pumped into the cooling channel inlet 302, flows through the cooling channel 306 to heat or cool the conductive body 300 of the substrate support 205 (depending on the relative temperatures of the heat transfer fluid and the substrate support 205), and is removed or exhausted from the cooling channel outlet 304.

In one embodiment, the heat transfer fluid may comprise water, ethylene glycol, a gas, or the like. In one embodiment, the heat transfer fluid comprises a mixture of water and ethylene glycol, for example, a mixture of 50% water and 50% ethylene glycol. In certain embodiments, a separate storage vessel may be coupled with the cooling channel outlet 304 to store used coolant. As shown in FIG. 3D, the cooling channel inlet 302 and the cooling channel outlet 304 are isolated from conductive leads 315a, 315b by the body of the shaft 126.

In one embodiment, the heat control gap 308 is positioned in the conductive body 300 of the pedestal 128 encircling the hollow portion of the shaft 126 to further control the path of heat flow. The flow of heat transfer fluid through the shaft 126 of the pedestal 128 creates a localized cold spot at the center of the support surface 210, the heat control gap 308 increases the thermal resistance around the center of the support surface 210 of the pedestal thereby acting as a cold spreader. With reference to FIG. 3C, the heat control gap 308 is formed by an upper wall 312, an opposing lower wall 313, and a peripheral wall 314 which surrounds the heat control gap 308. In one embodiment, the peripheral wall 314 is circular thus giving the heat control gap 308 a circular shape. The heat control gap 308 may also have any other shapes which provide for the desired amount of heat control for the active cooling system. For example, the heat control gap 308 may have a shape selected from other shapes such as ovals, squares, rectangles, and non-uniform shapes. In one embodiment, the heat control gap 308 has a diameter between about 2 inches (5.1 cm) and about six inches (15.2 cm). In one embodiment, the heat control gap 308 has a diameter between about 3 inches (7.6 cm) and about 4 inches (10.2 cm). The diameter of the heat control gap 308 may be varied in order to provide the desired amount of heat control. The distance between the upper wall and the lower wall (e.g. the height) of the heat control gap 308 may also be varied in order to provide the desired amount of heat control. In one embodiment, the height of the heat control gap 308 is between about 0.1 inches (0.3 cm) and about 1 inch (2.5 cm). In another embodiment, the height of the heat control gap 308 is between about 0.4 inches (1 cm) and about 0.5 inches (1.3 cm).

In one embodiment, a top surface of the resistive heater 305 is positioned between about 0.10 inches (0.3 cm) and about 0.80 inches (2 cm) from the support surface 210 of the substrate support 205. In another embodiment, a top surface of the resistive heater 305 is positioned between about 0.15 inches (0.4 cm) and about 0.20 inches (0.5 cm) from the support surface 210 of the substrate support 205. In one embodiment, the upper wall 312 of the heat control gap 308 is positioned between about 0.5 inches (1.3 cm) and about 1.5 inches (3.8 cm) from the support surface 210 of the substrate support 205. In another embodiment, the upper wall of the heat control gap 308 is positioned between about 0.9 inches (2.3 cm) and about 1.2 inches (3.0 cm) from the support surface 210 of the substrate support 205. In one embodiment, an upper wall 350 of the cooling channel 307 is positioned between about 3 inches (7.6 cm) and about 5 inches (12.7 cm) from the support surface 210 of the substrate support 205. In another embodiment, the upper wall 350 of the cooling channel 307 is positioned between about 4 inches (10.2 cm) and about 4.5 inches (11.4 cm) from the support surface 210 of the substrate support 205.

In one embodiment, the cooling channel 307 is positioned at a distance "X" from the resistive heating element 305. In one embodiment, the upper wall 312 of the heat control gap 308 is positioned a distance "Y" from the bottom surface of the resistive heater 305. In one embodiment, the lower wall 313 of the heat control gap 308 is positioned at a distance "Z" from the cooling channel 307. In one embodiment, the distances "X", "Y", and "Z" are selected to drain the desired amount of heat from the pedestal 128.

FIG. 3D is a cross-sectional side view taken along line 3D-3D of FIG. 3A of one embodiment of a pedestal 128 having an active cooling system described herein. As shown in FIG. 3B, the shaft 126 is coupled to a power outlet or power box 103 as shown in FIG. 1. The resistive heater 305 is coupled to a power source 310 disposed in the power box 103 by conductive leads 315a, 315b disposed in the shaft 126. The shaft 126 also includes a longitudinal channel or hole 350 adapted to receive a thermocouple (not shown). In this embodiment, the dielectric plug 230 includes one or more conductive plugs 320 disposed therein to couple the conductive leads 315 with one or more respective sockets 326a, 326b disposed in the power box 103. In one embodiment, the conductive plugs 320 are multi-contact plugs. The conductive leads 315 and the conductive plugs 320 may be electrically biased during operation, but are electrically isolated from the slotted conductive portion 225, the shaft 126, and substrate support 205 by a peripheral wall 325 of the dielectric plug 230.

In one embodiment, the shaft 126 and substrate support 205 are made of aluminum and are electrically grounded. The aluminum material encapsulates the heating element and acts an effective RF shield for the resistive heater 305. The RF shielding by the aluminum material eliminates need for band pass filters to filter off RF coupling to the resistive heater 305, which may be needed in heated pedestals made of different materials, such as ceramic. The design of the electrical interface using conductive plugs 320 as power terminals for the resistive heater 305 enables standard gauge wires and connectors from the power box 103 to be used as opposed to custom designed electrical connectors. The conductive plugs 320 are mounted on a unique base design comprising a PEEK resin. The conductive plugs 320 comprise a power terminal assembly, which is mechanically supported by the dielectric plug 230 which fastens onto the conductive portion 225 of the base assembly 129. The PEEK resin electrically insulates the live power terminals (conductive plugs 320) against the grounded heater body (substrate support 205 and shaft 126). Thus, the pedestal 128 minimizes costs by the elimination of band-pass filters and utilizes less-expensive aluminum material, which significantly reduces cost of ownership. Further, the pedestal 128 as described herein may be retrofitted to replace original pedestals in existing chambers without extensive redesign and/or downtime.

Figure 4A:
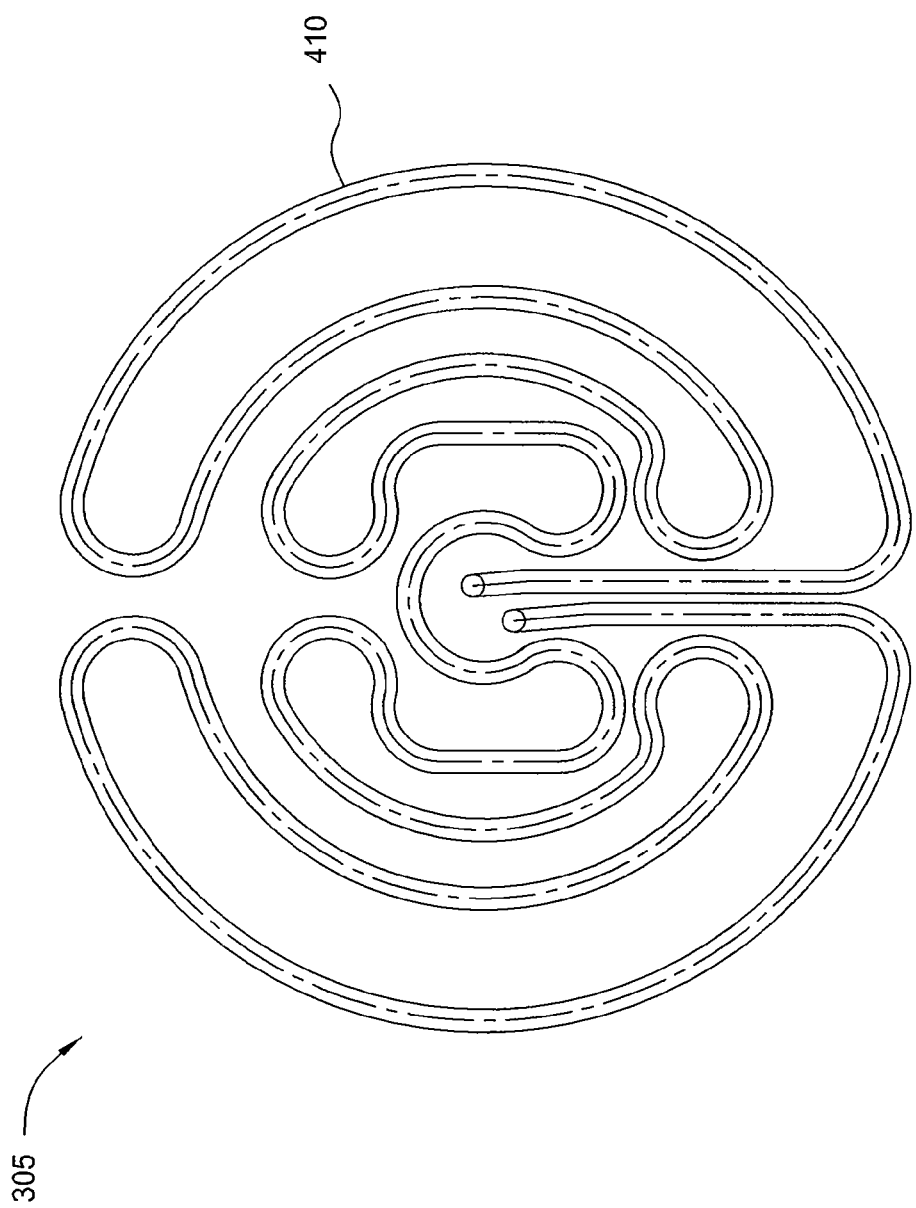
FIG. 4A is a schematic top view of one embodiment of a resistive heater.
Figure 4B:
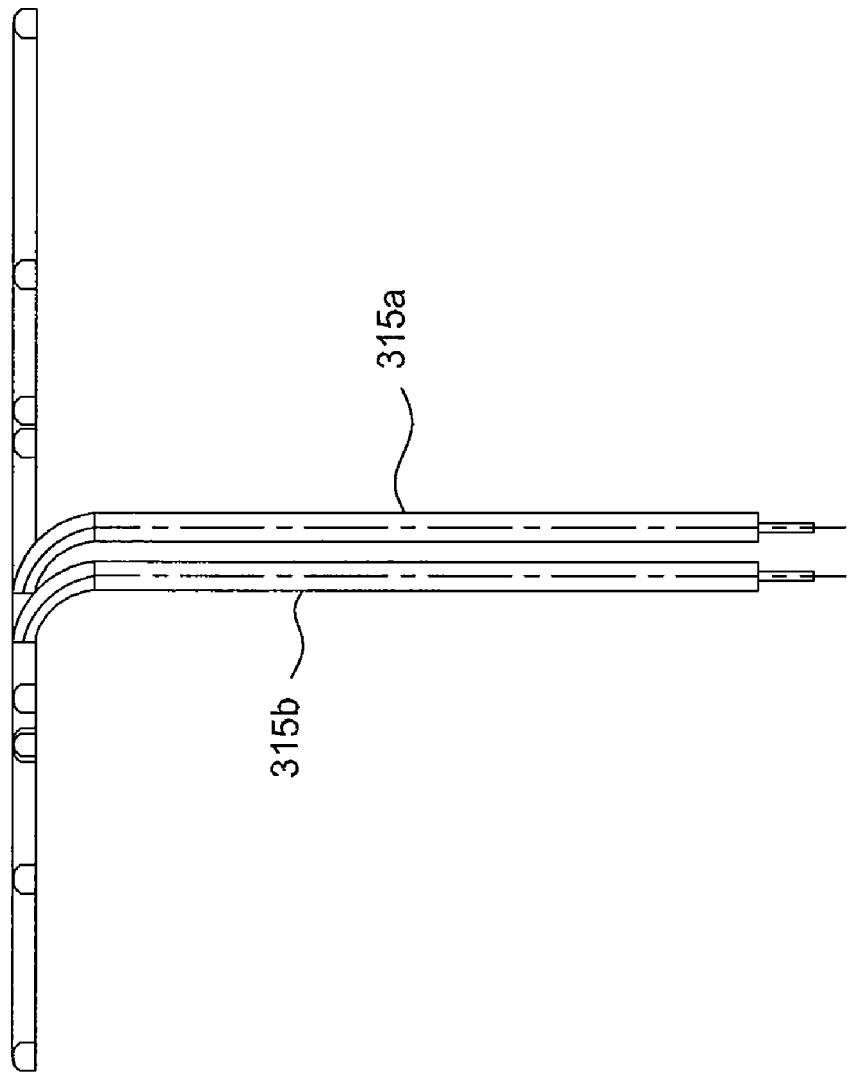
FIG. 4B is a schematic side view of one embodiment of a resistive heater.

FIG. 4A is a schematic top view of one embodiment of a resistive heater 305. FIG. 4B is a schematic side view of one embodiment of the resistive heater 305. In one embodiment, the resistive heater 305 comprises a heating element 410. As shown in FIG. 4A, the heating element 410 is patterned to provide a center dense pattern in the center portion of the resistive heater 305 to provide a radiant heating profile that matches and compensates for substrate thermal loss. For example, with reference to FIG. 3D, the heating element 410 is spaced closer together toward the center of the conductive support body 300 compared to the edges of the conductive support body 300. The flow of coolant through the shaft 126 creates a cold spot in the center of the support surface 210 relative to the edges of the support surface 210. Although shown as center dense, it should be understood that the heating element 410 may be adapted to encompass any variation in substrate loss heat profile. For example, the heating element 410 may be adapted to provide a variable amount of heat output by varying their size, spacing, resistivity, input power, or the like to more closely match the substrate loss profile.

Table I summarizes a thermal and structural modeling simulation of a pedestal using the active cooling system describe herein. The Inlet Temp [° C.] represents the inlet temperature of the heat transfer fluid as it enters the cooling channel assembly. The Outlet Temp [° C.] represents the outlet temperature of the heat transfer fluid as it exits the active cooling assembly. The Volume Flow Rate [GPM] represents the gallons per minute of coolant flowing through the cooling channel assembly. The Temp Set Point [° C.] represents the set point temperature of the resistive heater. The Temp Gradient [° C.] represents the temperature difference between the high temperature and the low temperature on the support surface of a pedestal using the active cooling system described herein. The Max Deform [mil] represents the maximum planar deflection of the pedestal. Deflection has two modes, first, the support surface and conductive body of the pedestal may warp, second, the shaft of the pedestal may tilt due to the temperature change between inner fluid and outer fluid. The Max Deformation Results indicate that the embodiments depicted herein can yield a maximum planar deflection of the support surface of no greater than five thousandth of an inch (5 mils).

TABLE 1

Results for thermal and structural modeling of pedestal.

| Inlet Temp. [° C.] | Outlet Temp. [° C.] | Volume Flow Rate [GPM] | Temp. Set Point [° C.] | RF Coupling Power | Power In [W] | Temp. Gradient [° C.] | Max Deform. [mil] |
|---|---|---|---|---|---|---|---|
| 25 | 26.4 | 1.5 | — | 430 | 0 | 7.18 | 1.86 |
| 25 | 26.6 | 1.5 | 180 | 430 | 196 | 7.91 | 2.45 |
| 25 | 41.8 | 0.1 | 400 | 0 | 1410 | 9.29 | 4.84 |

While the foregoing is directed to embodiments of the present invention, other and further embodiments of the invention may be devised without departing from the basic scope thereof, and the scope thereof is determined by the claims that follow.

The invention claimed is:

1. A pedestal for a semiconductor processing chamber, comprising:
   a substrate support comprising a conductive material and having a support surface for receiving a substrate;
   a resistive heater encapsulated within the substrate support;
   a hollow shaft coupled to the substrate support at a first end and to a mating interface at a second end, the hollow shaft comprising:
   a shaft body having:
      a hollow core; and
      a cooling channel assembly encircling the hollow core and disposed within the shaft body for removing heat from the pedestal via an internal cooling path, wherein the substrate support has a heat control gap positioned between the heating element and a ring-shaped cooling channel.

2. The pedestal of claim 1, wherein the resistive heater comprises a heating element having a center dense pattern to provide a radiant heating profile that matches and compensates for substrate thermal loss.

3. The pedestal of claim 1, wherein the cooling channel assembly comprises:
   the ring-shaped cooling channel;
   a cooling channel inlet for delivering a heat transfer fluid to the ring-shaped cooling channel; and
   a cooling channel outlet for removing the heat transfer fluid from the ring-shaped cooling channel.

4. The pedestal of claim 3, wherein the cooling channel assembly further comprises a fluid recirculator coupled with the cooling channel inlet and the cooling channel outlet for supplying the heat transfer fluid to the ring-shaped cooling channel.

5. The pedestal of claim 4, wherein the cooling channel inlet extends longitudinally through the shaft body.

6. The pedestal of claim 1, wherein the heat control gap is formed by:
   an upper wall;
   an opposing lower wall; and
   a peripheral wall which surrounds the heat control gap, wherein the peripheral wall is circular, thus giving the heat control gap a circular shape.

7. The pedestal of claim 6, wherein the heat control gap has a diameter between about 7.6 cm and about 10.2 cm and a height of between about 1 cm and about 1.3 cm.

8. The pedestal of claim 6, wherein a top of the resistive heater is positioned between about 0.3 cm and about 2 cm from the support surface of the substrate support and the upper wall of the heat control gap is positioned between about 1.3 cm and about 3.8 cm from the support surface.

9. The pedestal of claim 3, wherein the mating interface comprises:
   a dielectric plug comprising:
      at least one exposed electrical connector being adapted to couple a power outlet disposed on the processing chamber and being electrically isolated from the hollow shaft, wherein the cooling channel inlet and the cooling channel outlet traverse the dielectric plug and are electrically isolated from the at least one exposed electrical connector.

10. The pedestal of claim 1, wherein a top of the cooling channel is positioned a distance from the resistive heater to yield a maximum planar deflection of the support surface of no greater than five thousandth of an inch.

11. The pedestal of claim 9, further comprising a pair of conductive leads coupling the mating interface with the encapsulated resistive heater, wherein the conductive leads are positioned within the hollow core.

12. A pedestal for a semiconductor processing chamber, comprising:
   a substrate support comprising a conductive material and having a support surface for receiving a substrate;
   a hollow shaft coupled with the substrate support comprising:
      a shaft body having a hollow core; and
   an active cooling system providing for active control of the temperature of a substrate positioned on the support surface comprising;
      a heating element encapsulated within the substrate support; and
      a cooling channel assembly encircling the hollow core and disposed within the shaft body for removing heat from the pedestal via an internal cooling path, wherein a heat control gap is positioned between the heating element and a ring-shaped cooling channel.

13. The pedestal of claim 12, wherein a top of the cooling channel is positioned a distance from the heating element to yield a maximum planar deflection of the support surface of no greater than five thousandth of an inch.

14. The pedestal of claim 13, wherein the resistive heater comprises a heating element having a center dense pattern to provide a radiant heating profile that matches and compensates for substrate thermal loss.

15. The pedestal of claim 12, wherein the cooling channel assembly comprises:
   the ring-shaped cooling channel;
   a cooling channel inlet for delivering a heat transfer fluid to the ring-shaped cooling channel; and
   a cooling channel outlet for removing the heat transfer fluid from the ring-shaped cooling channel.

16. The pedestal of claim 15, wherein the cooling channel assembly further comprises a fluid recirculator coupled with the cooling channel inlet and the cooling channel outlet for supplying the heat transfer fluid to the ring-shaped cooling channel.

17. The pedestal of claim 15, wherein the cooling channel inlet extends longitudinally through the shaft body.

18. A plasma processing system, comprising:
   a processing chamber body having:
      sidewalls;
      a bottom wall; and
      an interior sidewall defining a pair of processing regions; and
   a pedestal disposed in at least one of the pair of processing regions; comprising:
      a substrate support comprising a conductive material and having a support surface for receiving a substrate;
      a hollow shaft coupled with the substrate support comprising:
         a shaft body having a hollow core; and
      an active cooling system providing for active control of the temperature of a substrate positioned on the support surface comprising;
         a heating element encapsulated within the substrate support; and
         a cooling channel assembly encircling the hollow core and disposed within the shaft body for removing heat from the pedestal via an internal cooling path, wherein a heat control gap is positioned between the heating element and a ring-shaped cooling channel; and a radio frequency source is coupled with the processing chamber body.

19. The system of claim 18, wherein the cooling channel assembly comprises:
   the ring-shaped cooling channel;
   a cooling channel inlet for delivering a heat transfer fluid to the ring-shaped cooling channel; and
   a cooling channel outlet for removing the heat transfer fluid from the ring-shaped cooling channel.

20. The system of claim 19, wherein the heat control gap is formed by:
   an upper wall;
   an opposing lower wall; and
   a peripheral wall which surrounds the heat control gap, wherein the peripheral wall is circular, thus giving the heat control gap a circular shape.

* * * * *